United States Patent [19]

Holick et al.

[11] 4,407,006
[45] Sep. 27, 1983

[54] SPIRAL STRIP BRUSHLIKE STRESS BUFFERING POWER SEMICONDUCTOR CONTACTS

[75] Inventors: Hubert Holick, Lampertheim; Alfred Jester, Speyer, both of Fed. Rep. of Germany

[73] Assignee: BBC Brown, Boveri & Company Limited, Baden, Switzerland

[21] Appl. No.: 182,822

[22] Filed: Aug. 29, 1980

[30] Foreign Application Priority Data

Sep. 13, 1979 [DE] Fed. Rep. of Germany ....... 2937049

[51] Int. Cl.³ .................... H01L 23/04; H01L 23/48
[52] U.S. Cl. ................................ 357/68; 267/181; 357/65; 357/79; 357/81
[58] Field of Search .................. 29/874, 884, 591; 357/65, 68, 79, 81; 428/596; 267/181, 75, 140.2

[56] References Cited

U.S. PATENT DOCUMENTS

| | | | |
|---|---|---|---|
| 2,927,953 | 3/1960 | Staller | 357/79 |
| 3,128,419 | 4/1964 | Walkoetter et al. | 357/81 |
| 3,273,029 | 9/1966 | Ross | 357/9 |
| 3,296,501 | 1/1967 | Moore | 357/81 |
| 3,387,191 | 6/1968 | Fishman et al. | 357/81 |
| 4,196,442 | 4/1980 | Kuniya et al. | 357/68 |
| 4,290,800 | 9/1981 | Hysell et al. | 357/79 |
| 4,315,591 | 2/1982 | Houston | 357/81 |
| 4,333,102 | 6/1982 | Jester et al. | 357/79 |

FOREIGN PATENT DOCUMENTS 1057241 11/1959 Fed. Rep. of Germany .
876133 8/1961 United Kingdom .

Primary Examiner—William D. Larkins
Attorney, Agent, or Firm—Oblon, Fisher, Spivak, McClelland & Maier

[57] ABSTRACT

A large area semiconductor disk, wherein in order to be able to connect, for example, by soldering, welding or diffusion-bonding the semiconductor disk with copper disks serving for the heat conduction and for the current supply, a copper tape wound to form a spiral is used to make the connection between the two disks. Transverse slots are etched or punched into the copper tape so that free V-shaped crosspieces are formed on one side. The ends of the cross-pieces are connected with the silicon disk, and measures are taken so that the crosspieces do not connect with each other. The other side of the wound tape is soldered to the copper disk. The radial thermal expansion differences between the copper disk and silicon disks, as well as the axial thermal expansion differences between the silicon disk and the casing, as well as production tolerances in the planeness of the copper and silicon disks are absorbed elastically by the corresponding V-shape of the crosspieces.

7 Claims, 7 Drawing Figures

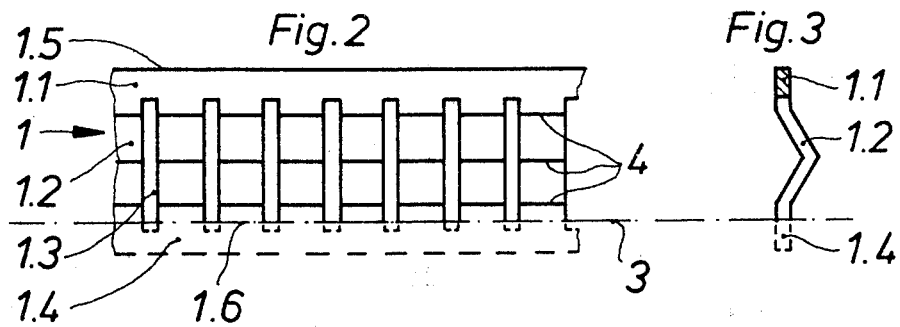
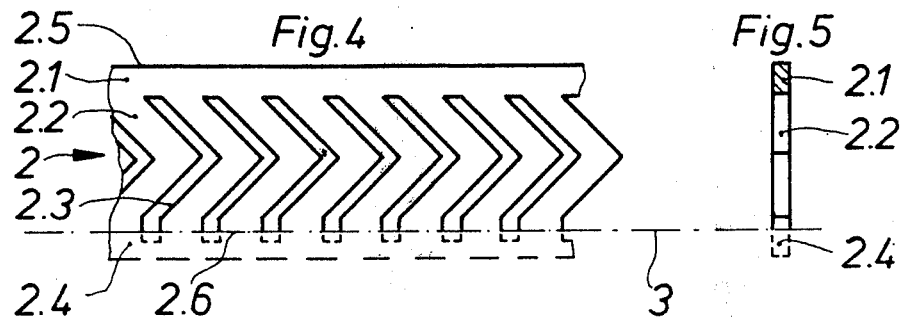
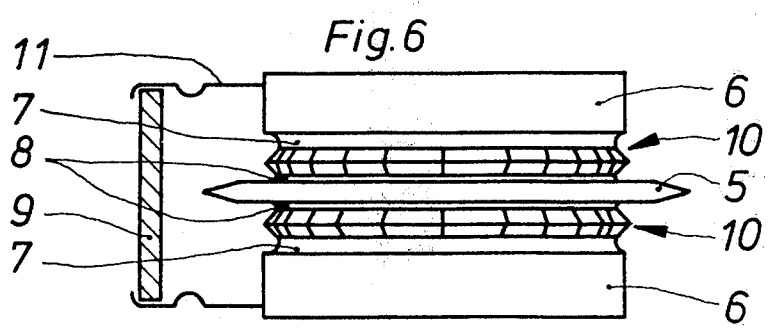
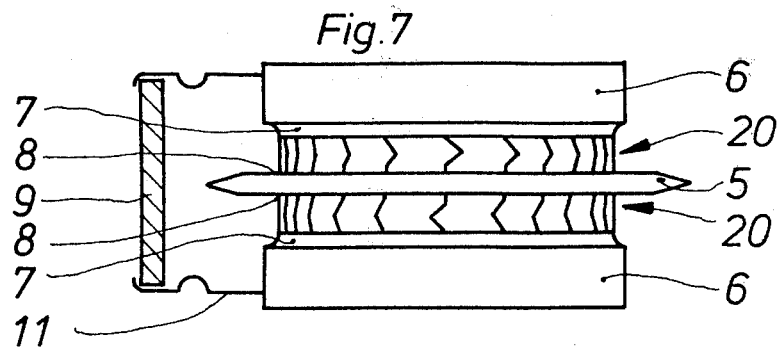

SPIRAL STRIP BRUSHLIKE STRESS BUFFERING POWER SEMICONDUCTOR CONTACTS

BACKGROUND OF THE INVENTION

1. Field of the Invention

This invention relates to a high performance semiconductor component provided with a casing in which a semiconductor disk having at least one pn-junction is material-connected with a metal disk, serving for heat conduction and for current supply, through numerous conductors forming a brush-like bundle wherein the conductors are material connected at one of their ends only with the semiconductor disk but not with each other.

2. Description of the Prior Art

Such a high performance semiconductor component is known from the German Patent Application P 28 55 493.0. The individual wires are embedded in silicone rubber and twisted in such a fashion that the outside wires are longer than the inside ones. Since the copper disk material-connected with the one end of the wire brush, i.e. by means of soldering, welding or diffusion-bonding, expands more when heated than the silicon disk material-connected with the other end of the wire brush, the outside individual wires must compensate for a larger radial difference in length than those which are further inside. When compensating for the radial differences in length, the twisting of the individual wires is partially eliminated, i.e. the length running in tangential direction is partially converted into a length running in radial direction whereby the distance between semiconductor disk and copper disk remains the same.

A spring contact element is known from the British Pat. 876,133 which consists of a spirally wound, slotted copper tape which bulges out in the area of the longitudinal slots. The wound copper tape spiral is held together at its upper and lower ends by a put-on cap and a soldered-on cap. One of the two caps is soldered to a metallic counter-electrode and this counter electrode, in its turn, to the semiconductor disk. Thus, the known contact element can only compensate for axial thermal expansion differences; radial thermal expansion differences are compensated for by the metal electrode soldered between cap and semiconductor disk. For this reason, the known semiconductor component can only be used for relatively low performances.

A largely solder-free contacting of a semiconductor disk with the outer connecting contacts is known from the German Disclosure Publication 15 14 149. For this purpose, a so-called multi-contact cushion which consists of a fine-wired, felt-like metal blank is pressed on the semiconductor disk. This is thus a special form of pressure contacting. Since the silicon disk expands by far less in radial direction when heated than the copper contact disk or the multi-contact cushion, respectively, the outer wires of the multi-contact cushion must slide on the surface of the silicon disk. Therefore, the application is not possible for large-area semiconductor components.

Since it has been determined in the past that soldered connections with semiconductor disks are only usable when the semiconductor disks do not exceed a certain diameter, the pressure contact technique has been generally applied for high performance semiconductor components with large-area silicon disks. The construction of such a pressure-coated semiconductor component is known, for example, from "IEEE Transactions on Electron Devices", Vol. Ed-26, No. 7, July 1979, pages 1085–1091. An essential characteristic of pressure-coated semiconductor components is the use of a molybdenum disk and/or a tungsten disk between a silicon disk and a copper disk serving as a heat reduction. Molybdenum and tungsten have thermal expansion coefficients which are similar to that of silicon. In this way, the surface of the silicon disk is exposed to little mechanical stress with thermal expansions. A disadvantage of this generally applied pressure contact technique is the low thermal conductivity of tungsten, and particularly molybdenum, as well as the bad contact which exists only at a few points between the silicon and tungsten or molybdenum disks. This point contact which exists only at a few places leads to an additional reduction in the heat conduction from the silicon disk as well as to a concentration of the electrical current on these few contact points. The authors of the above-noted literature reference come to the conclusion, on the basis of theoretical considerations and practical investigations, that the surge current resistance of a given silicon tablet could be increased by approximately 50% and the continuous direct current resistance by approximately 90% by eliminating the point contacts between the silicon disk and the metal disks resting on top and between the metal disks among themselves. Further dramatic improvements could be reached if one would succeed in replacing the tungsten and molybdenum disks by copper cooling bodies. However, it is also pointed out that the thermal-mechanical problems occurring in this instance, such as the grating of the silicon disk on parts of the casing or the hardening of the soldered connections, could not be controlled with the customary means.

SUMMARY OF THE INVENTION

Accordingly, the objects of this invention are to provide an improved contact bundle for high performance semiconductor components of the above-described type which can be produced at still lower costs and which permits a still better compensation for different radial expansions.

These objects are achieved by providing a contact bundle consisting of a metal tape wound in the form of a spiral, with the tape provided with transverse slots at regular intervals in such a manner that a great number of resilient metal crosspieces are formed which are connected on one side by a non-slotted piece of the metal tape.

Preferably, the transverse slots in the metal tape are straight and the metal tape itself is provided with a stiffening corrugation which is V-shaped in its cross-section.

According to another advantageous embodiment, the transverse slots are V-shaped themselves. According to the invention, the brush or spring package can advantageously be produced very easily since the copper tape can be provided with the necessary transverse slots in a single continuous operation. The winding of the tape into a spiral is also simple and can be carried out fully automatically. The radial expansion differences between silicon disk and cooling body can be elastically compensated for by the lengths of the individual crosspieces caused by the V-shape. Furthermore, the brush or spring package according to the invention has spring-like properties also in the axial direction; depending on the design, it is more elastic than massive copper by a factor of 100 to 1000. Tolerances in the plane bridged so that manufacturing precision can be reduced when producing the surfaces and thus also the manufacturing costs. The stiffness of the entire package can be optionally adjusted through the thickness and the shape of the individual resilient crosspieces. For example, when selecting stiff spring characteristics in the axial direction, the finished semiconductor component can be contacted by pressure from outside in the known manner whereby, however, the molybdenum disk previously used is replaced by the brush package according to the invention. At the same time, the necessary outer pressing forces can be reduced.

An essential advantage of the contact according to the invention lies, however, in the reduced thermal and electrical transition resistance which is caused by the material connection between silicon disk and spring contact. The material connection of each individual crosspiece leads also to a uniform current flow which leads, in its turn, to a considerably more favorable current surge behavior.

Preferably, the transverse slots are punched or etched into the metal tape. Particularly, the etching process is suitable for an automatic production process. In accordance with an advantageous embodiment, the frontal areas of the metal tape or of the metal crosspiece are treated in a connection-promoting manner. This can be done, for example, by coating the frontal areas with solder when a soldered connection is planned or with gold when a diffusion bond is intended.

In order to prevent the individual resilient crosspieces from entering into a material connection also with each other, their surfaces are preferably treated in a solder-repellent way. This solder-repelling coating can exist, for example, of carbon, of aluminum, of an oxide or of another moisture-repellent material.

Preferably, the frontal area of the non-slotted piece of the metal tape is material-connected with the metal disk. This type of connection is particularly advantageous when the metal tape, as well as the metal disk, consist of copper or of a copper alloy. In this instance, no thermal expansion differences will occur between the metal disk and the metal tape.

Preferably, the width of the transverse slots is essentially smaller than the thickness of the tape. In this manner, an especially high portion of metal is involved in the connecting element according to the invention whereby the thermal and electrical transfer resistance approaches that of compact metal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2 and 3 are schematic diagrams of a first exemplified embodiment of a metal tape;

FIGS. 4 and 5 are schematic diagrams of a second exemplified embodiment of a metal tape;

FIG. 6 is a schematic cross-sectional view taken through a high performance semiconductor component employing the metal tape of the first exemplified embodiment;

FIG. 7 is a schematic cross-sectional view taken through a high performance semiconductor component employing the metal tape of the second exemplified embodiment.

DESCRIPTION OF THE PREFERRED EMBODIMENTS

Figure 1:
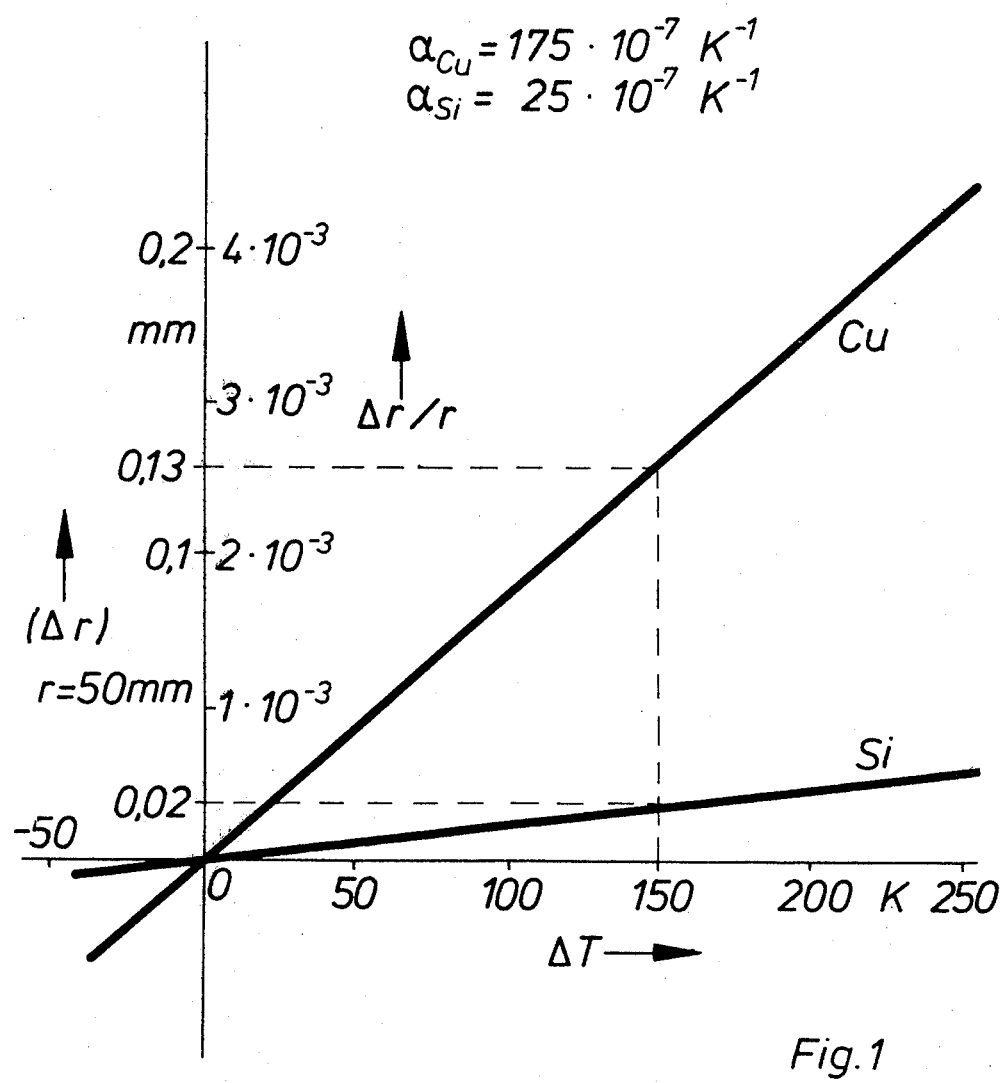
FIG. 1 is a graph illustrating the temperature-related expansion differences of silicon and copper.

Referring now to the drawings, wherein like reference numerals designate identical or corresponding parts throughout the several views, and more particularly to FIG. 1 thereof, there is seen plotted in a rectangular coordination system having on its abscissa the temperature difference $\Delta T$ in Kelvin and, on its ordinate in the right-hand graduation, the relative enlargement $\Delta r/r$ of a disk with the radius r and, in its left-hand graduation, the absolute change in length $\Delta r$ in millimeters for a disk with a radius r=50 mm. It can be recognized that with the temperature increase $\Delta T=150°$ K. entered as an example, a silicon disk enlarges its radius by 0.02 mm and a copper disk of equal size by 0.13 mm. The difference in radius of 0.11 mm must be absorbed by the connecting member between the copper disk and the silicon disk without mechanically destroying one of the participating elements or impairing the electrical and thermal transfer.

FIG. 2 as a top view, and FIG. 3 as a lateral side view, show a first design of a metal tape which, after it has been wound to form a spiral, produces a good and elastic connection between a silicon disk and a copper heat conduction disk. The metal tape 1 is provided with transverse slots 1.3 at regular intervals between which metallic, resilient crosspieces 1.2 remain which are held together at their top ends by a non-slotted metal piece 1.1. When producing the slots, there is also a non-slotted metal piece 1.4 at the lower end of the metal tape 1 which, however, is cut off later along a separating line 3. The metal tape 1 is bent along the bending lines 4 in such a way that a corrugation, V-shaped in its cross-section, results as it is shown in FIG. 3. The upper frontal area 1.5 of the metal tape 1 is later material-connected with a thermal conduction disk and the lower frontal area 1.6 of the metal crosspieces 1.2 with a silicon disk. The difference in length caused by the different expansion coefficients is absorbed in the V-shaped corrugation in that the resilient crosspieces 1.2 stretch or bend accordingly.

FIG. 4 as a top view and FIG. 5 as a lateral side view show another design of a metal tape according to the invention. The metal tape 2 is provided with a number of V-shaped transverse slots 2.3 between which V-shaped metal crosspieces 2.2 remain as well, which are held together at their upper ends by a non-slotted piece 2.1 of the metal tape 2. A piece 2.4 of the metal band 2 at the lower end which is also non-slotted was cut off along the separating line 3 so that the metal crosspieces 2.2 are free at their lower ends. As is shown in FIG. 5, the metal tape 2 remains planar. The radial expansion differences between a thermal conduction disk fastened to the upper frontal area 2.5 and a silicon disk fastened to the lower frontal area 2.6 of the crosspieces 2.2 is compensated for by the V-shape of the metal crosspieces 2.2 owing to the fact that the metal crosspieces 2.2 are more or less twisted.

FIG. 6 shows a fully assembled high performance semiconductor component. There is shown a casing 9 of insulation material to which metal disks 6 are fastened through metal annular parts 11 which serve for the removal of the heat as well as for the supply of current and voltage. The metal tape 1 wound to form a spiral 10 is fastened with the metal disks 6 which consist, for example, of copper through a soldered connection 7. The frontal areas of the crosspieces are material-connected with the contact surfaces of a silicon tablet 5 through an additional soldered connection 8. It can be easily understood that, through the winding of more or less metal tape, the size of the spiral 10 can be adapted to the size of the surfaces to be contacted on the silicon disk 5 or thermal conduction disk 6. It is also possible to leave an opening in the center of the spiral 10 through which the central gate of a thyristor can be contacted.

FIG. 7 shows a similar design where one spiral 20 which was made of the metal tape 2 is used as an intermediate member between thermal conduction disk 5 and silicon disk 6. It can also be recognized that the sense of the winding of the upper spiral 20 is opposite to the sense of the winding of the lower spiral 20. In this way, the silicon disk 5 can perform a rotary movement with an expansion difference between semiconductor disk and thermal conduction disk by means of which a part of the mechanical tension is reduced which develops in the resilient crosspieces of the metal tape 2.

For the production of the connecting element according to the invention, a copper tape of a suitable width is provided with the transverse slots by punching or etching and, possibly, with the V-shaped corrugation. At this point in time, the resilient crosspieces are still connected at both ends by a non-slotted piece of the metal tape. Subsequently, the tape is wound to form a spiral and is material-connected with a copper disk through soldering, welding or diffusion-bonding. Now, the free frontal area of the spiral is ground down until the individual resilient crosspieces stand freely. Then the frontal areas of the crosspieces are prepared for the connection with the silicon disk by placing, for example, gold or solder on them. The frontal areas prepared in this manner are attached to a correspondingly prepared surface of the silicon disk and connected with it by means of heat and pressure. Since each individual crosspiece is resilient in itself, it can compensate, without any problems, for small differences in length which are caused by an incomplete processing of the surface of the silicon disk or of the copper spiral. In order to prevent that solder, softening under the influence of pressure and heat, will creep also up between the hair-sized interspaces of the individual resilient crosspieces, the lateral surfaces of the crosspieces are coated with a solder-repellant material.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor component formed of a casing in which a semiconductor disk having at least one pn-junction is material-connected with a metal disk, serving as a heat conduction path and as a current supply path, comprising:
   a planar metal tape wound to form a spiral for making a connection of the metal disk to the semiconductor disk;
   said tape provided with plural transverse slots at regular intervals to form plural resilient metal crosspieces, building numerous conductors arranged in a brush-like bundle;
   said transverse slots being V-shaped and in the plane of the metal tape,
   each of the crosspieces having one end material-connected only with the semiconductor disk but not with each other, and being inter-connected at the other end by a non-slotted piece of the metal tape,
   said non-slotted piece having a frontal area material-connected with the metal disk.

2. A semiconductor component according to claim 1, further comprising:
   the transverse slots having a width smaller than the thickness of the tape.

3. A semiconductor component according to claim 1, further comprising:
   said metal tape consisting of copper or of a copper alloy.

4. A semiconductor component according to claim 1, further comprising:
   the metal tape or the metal crosspieces having frontal areas provided with a coating to enhance electrical and mechanical connection thereto.

5. A semiconductor component according to claim 1, further comprising:
   the surfaces of the metal crosspieces provided with a solder-repelling coating.

6. A semiconductor component according to claim 1, wherein the transverse slots are punched into the metal tape.

7. A semiconductor component according to claim 1, wherein the transverse slots are etched into the metal tape.

* * * * *